(12) United States Patent
Chow et al.

(10) Patent No.: US 12,327,738 B2
(45) Date of Patent: Jun. 10, 2025

(54) INTEGRATED SEMICONDUCTOR PART CLEANING SYSTEM

(71) Applicant: Applied Materials, Inc., Santa Clara, CA (US)

(72) Inventors: Jenn C. Chow, San Jose, CA (US); David W. Groechel, Los Altos Hills, CA (US); Tuochuan Huang, Saratoga, CA (US); Dorothea Buechel-Rimmel, Sunnyvale, CA (US); Han Wang, Palo Alto, CA (US); Li Wu, Fremont, CA (US); Gang Peng, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 268 days.

(21) Appl. No.: 16/400,603

(22) Filed: May 1, 2019

(65) Prior Publication Data

US 2019/0341276 A1    Nov. 7, 2019

Related U.S. Application Data

(60) Provisional application No. 62/666,529, filed on May 3, 2018.

(51) Int. Cl.
    *H01L 21/67*   (2006.01)
    *B08B 3/02*    (2006.01)
    *B08B 3/12*    (2006.01)

(52) U.S. Cl.
    CPC .......... *H01L 21/67051* (2013.01); *B08B 3/02* (2013.01); *B08B 3/12* (2013.01)

(58) Field of Classification Search
    CPC ......... H01L 21/67051; H01L 21/67751; H01L 21/67028; H01L 21/68728; H01L 21/67173; B08B 3/02; B08B 3/12

USPC .............................. 134/1, 10, 26, 32, 34, 36
    See application file for complete search history.

(56) References Cited

U.S. PATENT DOCUMENTS

| | | | | |
|---|---|---|---|---|
| 3,868,272 | A * | 2/1975 | Tardoskegyi | H05K 3/26 134/26 |
| 5,039,349 | A * | 8/1991 | Schoeppel | B08B 3/02 134/26 |
| 5,159,945 | A * | 11/1992 | Bannon | B08B 3/12 134/135 |
| 5,578,273 | A * | 11/1996 | Hanson | H01L 21/02052 257/E21.228 |

(Continued)

*Primary Examiner* — Joshua L Allen
*Assistant Examiner* — Christopher Remavege
(74) *Attorney, Agent, or Firm* — Patterson + Sheridan, LLP

(57) ABSTRACT

Embodiments described herein relate to chamber component cleaning systems and methods for cleaning a chamber component. The chamber component cleaning system includes a spray station, at least a first cleaning station, a dry station, a component transfer mechanism, and one or more enclosures that enclose the spray station, at least the first cleaning station, the dry station, and the component transfer mechanism. The spray station has a holder to position a chamber component in a path of a flow of a cleaning spray and a movable nozzle to provide the flow of the cleaning spray at a first pressure in a path of portions of the chamber component. The first cleaning station has a push mechanism to force a cleaning fluid through features and/or holes of the chamber component and at least one movable transducer to provide ultrasonic energy to the portions of the chamber component.

20 Claims, 6 Drawing Sheets

(56) References Cited

U.S. PATENT DOCUMENTS

| | | | | |
|---|---|---|---|---|
| 5,647,386 A * | 7/1997 | Kaiser | B08B 3/12 | 134/113 |
| 5,651,797 A * | 7/1997 | Laube | B08B 3/12 | 134/32 |
| 5,660,640 A * | 8/1997 | Laube | B08B 3/08 | 134/1 |
| 5,983,909 A * | 11/1999 | Yeol | B01F 3/04985 | 134/102.1 |
| 6,109,277 A * | 8/2000 | Linton | B08B 3/006 | 134/108 |
| 6,115,541 A * | 9/2000 | Rhodes | B08B 3/02 | 134/96.1 |
| 6,145,518 A * | 11/2000 | Huffman | B08B 3/08 | 134/184 |
| 6,279,584 B1 * | 8/2001 | Huffman | B08B 3/12 | 134/13 |
| 7,052,553 B1 * | 5/2006 | Shih | B08B 3/12 | 134/1 |
| 7,128,075 B2 * | 10/2006 | Publ | B08B 3/006 | 134/107 |
| 7,767,028 B2 * | 8/2010 | Augustino | C23C 16/4405 | 134/28 |
| 7,910,218 B2 * | 3/2011 | Lin | C23C 14/564 | 428/469 |
| 8,235,580 B2 * | 8/2012 | Fanjat | H01L 21/6715 | 366/132 |
| 8,763,619 B2 * | 7/2014 | Lele | B08B 3/006 | 134/147 |
| 9,079,228 B2 * | 7/2015 | Shih | B08B 3/08 | |
| 2002/0104552 A1 * | 8/2002 | Bay | H01L 21/67017 | 134/36 |
| 2003/0116174 A1 * | 6/2003 | Park | C11D 7/02 | 134/1.3 |
| 2004/0099285 A1 * | 5/2004 | Wang | C23C 14/564 | 134/8 |
| 2004/0244824 A1 * | 12/2004 | Yasukawa | B08B 13/00 | 134/66 |
| 2005/0115593 A1 * | 6/2005 | Publ | B08B 3/14 | 134/61 |
| 2005/0119571 A1 * | 6/2005 | Busch | G01N 29/28 | 600/437 |
| 2005/0274396 A1 * | 12/2005 | Shih | H01J 37/32862 | 134/29 |
| 2006/0042652 A1 * | 3/2006 | Satoyoshi | B08B 3/12 | 134/1 |
| 2006/0141802 A1 * | 6/2006 | Shih | C11D 11/0047 | 438/753 |
| 2008/0142055 A1 * | 6/2008 | Yin | H01L 21/67051 | 134/95.1 |
| 2008/0223401 A1 * | 9/2008 | Augustino | C23C 14/564 | 134/3 |
| 2009/0038645 A1 * | 2/2009 | Nomura | B08B 3/14 | 134/18 |
| 2010/0307544 A1 * | 12/2010 | Lele | B08B 3/10 | 134/105 |
| 2015/0380280 A1 * | 12/2015 | Amiya | H01L 21/67051 | 137/613 |
| 2019/0176403 A1 * | 6/2019 | Hutchinson | B33Y 40/00 | |
| 2019/0315065 A1 * | 10/2019 | Hutchinson | B08B 3/12 | |
| 2020/0040763 A1 * | 2/2020 | Wang | B64F 5/30 | |
| 2020/0329679 A1 * | 10/2020 | Robinson | C02F 9/00 | |

* cited by examiner

INTEGRATED SEMICONDUCTOR PART CLEANING SYSTEM

CROSS-REFERENCE TO RELATED APPLICATIONS

This application claims the benefit of U.S. Provisional Patent Application Ser. No. 62/666,529, filed May 3, 2018, which is herein incorporated by reference.

BACKGROUND

Field

Embodiments of the present disclosure generally relate to apparatuses and methods to clean equipment. More particularly, embodiments of the present disclosure relate to apparatuses and methods to clean semiconductor chamber components.

Description of the Related Art

In the cleaning of semiconductor chamber components, it is often desirable to remove contaminants from the chamber components. For example, contaminants such as trace metal particles can be bound to the metal, ceramic, and quartz chamber components used in semiconductor device processing. Absent cleaning, the particles deposit on substrates and negatively impact semiconductor device performance.

Cleaning the chamber, known as process maintenance or PM, shuts down production. No semiconductor devices can be processed in the chamber during PM. Hence, PM greatly impacts semiconductor device throughput. Therefore, reducing PM time would be beneficial. Cleanliness of chamber components, impacts product yield, chamber uptime, and customer's cost of ownership.

Most current cleaning techniques are manually performed by cleaning technicians, and therefore vary with the technician. Thus, the cleaning techniques are not precise, not repeatable, and can result in insufficient removal of the particles from chamber components.

Accordingly, what is needed in the art are chamber component cleaning systems and methods for cleaning a chamber component.

SUMMARY

In one embodiment, a chamber component cleaning system is provided. The system includes an enclosure including a body and a base. The body has an input port and an output port for one or more chamber components to enter and exit the enclosure. A spray station is disposed within the enclosure. The spray station includes a spray station enclosure, a spray nozzle, and a spray station holder operable to retain a chamber component and position the chamber component in a path of a flow of a first cleaning fluid delivered from the spray nozzle disposed within the spray station enclosure. A first cleaning station is disposed within the enclosure. The first cleaning station includes at least one cleaning station nozzle bar disposed in a clean station enclosure. The cleaning station nozzle bar is configured to provide a flow of a second cleaning fluid to the chamber component when the chamber component is disposed within the clean station enclosure. A cleaning station holder is included and is operable to retain and rotate the chamber component in any orientation within the clean station enclosure. A push mechanism is included and is operable to force the cleaning fluid through at least one of features and holes of the chamber component. At least one movable transducer is included to provide ultrasonic energy to portions of the chamber component. A dry station disposed within the enclosure. The dry station includes a dry station enclosure and a drying knife. The drying knife is configured to deliver a drying agent to the chamber component while the chamber component is disposed within the dry station enclosure. A component transfer mechanism disposed within the enclosure. The component transfer mechanism is configured to transfer the chamber component between at least the spray station, the first cleaning station, and the dry station. Each of the spray station enclosure, the cleaning station enclosure, and the dry station enclosure have an opening for the component transfer mechanism to capture the chamber component and release the chamber component.

In another embodiment, a method for cleaning a chamber component is provided. The method includes positioning a chamber component into an enclosure of a chamber component cleaning system. The enclosure has a least a spray station, first cleaning station, and dry station disposed therein. The method includes transferring the chamber component to a spray station using a component transfer mechanism, providing a flow of a cleaning spray at a first pressure on portions of the chamber component and positioning the portions of the chamber component in a path of the flow of the cleaning spray, transferring the chamber component to a first cleaning station using the component transfer mechanism, soaking the chamber component at the first cleaning station, forcing a first cleaning fluid through at least one of features and holes of the chamber component, and providing ultrasonic energy to the portions of the chamber component, transferring the chamber component to a dry station using the component transfer mechanism, and drying the chamber component in the dry station using a flow of a drying agent at a third pressure and positioning the portions of the chamber component in a path of the flow of the drying agent.

In yet another embodiment, a method for cleaning a chamber component is provided. The method includes transferring a chamber component to a spray station using a component transfer mechanism, providing a flow of a cleaning spray at a first pressure on portions of the chamber component and positioning the portions of the chamber component in a path of the flow of the cleaning spray, transferring the chamber component to a first cleaning station using the component transfer mechanism, soaking the chamber component at the first cleaning station in a hydrogen fluoride (HF) solution, forcing the HF solution through at least one of features and holes of the chamber component, and providing ultrasonic energy to the portions of the chamber component, transferring the chamber component to a second cleaning station using the component transfer mechanism, soaking the chamber component in the second cleaning station with a deionized water (DIW) solution, forcing the DIW solution through the at least one of features and holes of the chamber component, and providing the ultrasonic energy to the portions of the chamber component, transferring the chamber component to a third cleaning station using the component transfer mechanism, soaking the chamber component in the third cleaning station with an ammonium hydroxide ($NH_4OH$) solution, forcing the $NH_4OH$ solution through the at least one of features and holes of the chamber component, and providing the ultrasonic energy to the portions of the chamber component, transferring the chamber component to a dry station using the component transfer mechanism, and drying the chamber component in the dry station using a flow of a drying agent at a third pressure from at least one drying knife and positioning the portions of the chamber component in a path of the flow of the drying agent.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments described herein relate to chamber component cleaning systems and methods for cleaning a chamber component. The chamber component cleaning system includes a spray station, at least a first cleaning station, a dry station, a component transfer mechanism, and one or more enclosures that enclose the spray station, at least the first cleaning station, the dry station, and the component transfer mechanism. The spray station has a holder to position a chamber component in a path of a flow of a cleaning spray and a movable nozzle to provide the flow of the cleaning spray at a first pressure on to portions of the chamber component. The first cleaning station has a push mechanism to force a cleaning fluid through features and/or holes of the chamber component and at least one movable transducer to provide ultrasonic energy to the portions of the chamber component. In one embodiment, the features are high aspect ratio features. The component transfer mechanism has a range of motion to transfer a chamber component between each station.

Figure 1:
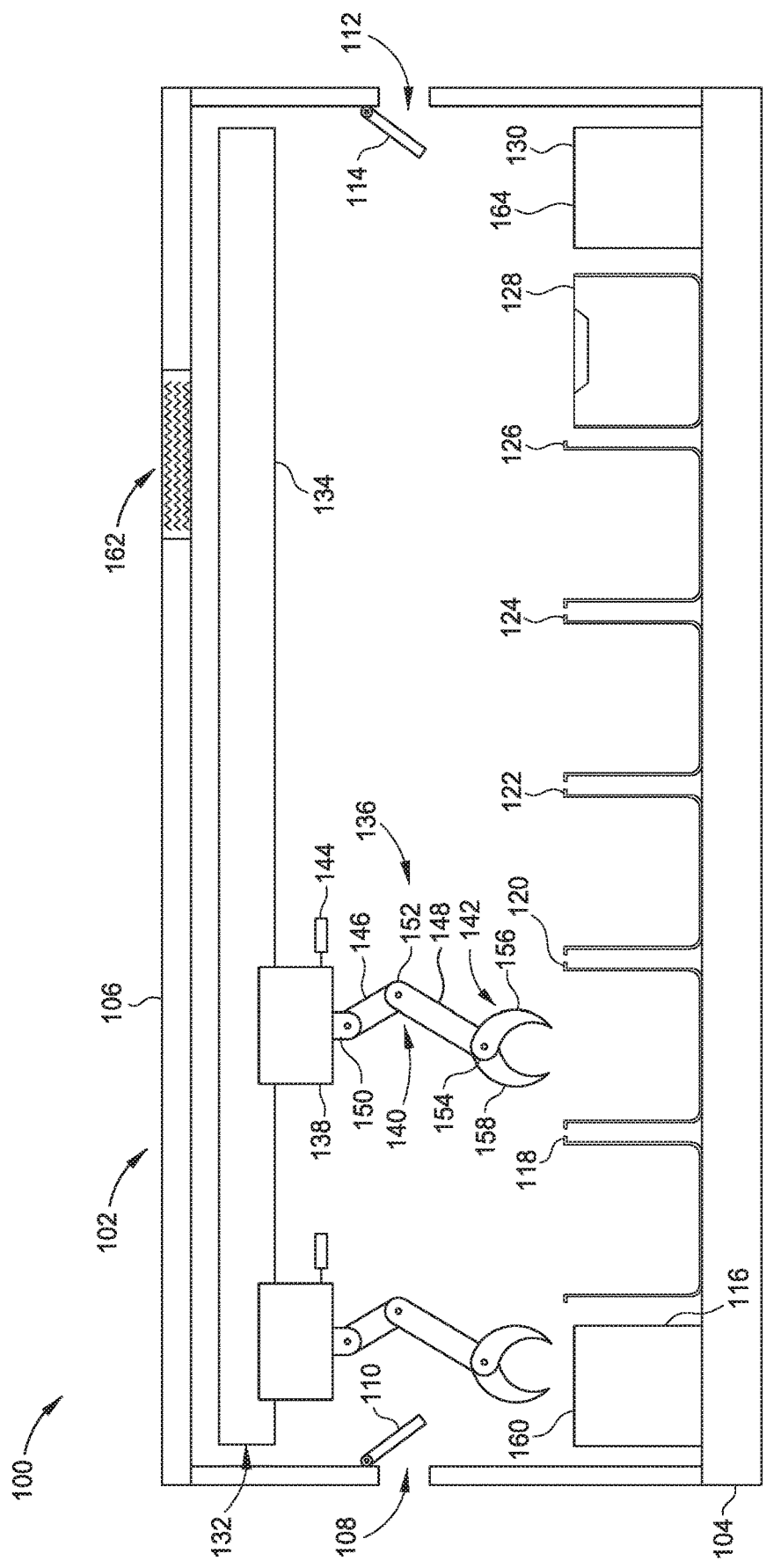
FIG. 1 is a schematic cross-sectional view of a chamber component cleaning system according to an embodiment.

FIG. 1 is a schematic cross-sectional view of a chamber component cleaning system 100 according to one embodiment. The chamber component cleaning system 100 includes an enclosure 102 coupled to a base 104. In another embodiment, the chamber component cleaning system 100 includes one or more enclosures. The enclosure 102 includes a body 106 having an input port 108 coupled to an input port door 110 and an output port 112 coupled to an output door 114. A spray station 118, at least a first cleaning station 120, and a dry station 126 are disposed in the body 106 of the enclosure 102 and coupled to the base 104. In another embodiment, the spray station 118, at least the first cleaning station 120, and the dry station 126 are disposed in one or more enclosures. In one embodiment, a loading station 116, a second cleaning station 122, the third cleaning station 124, a bake station 128, and an unloading station 130 are disposed in the body 106 of the enclosure 102 and coupled to the base 104. In another embodiment, the loading station 116, the second cleaning station 122, the third cleaning station 124, the bake station 128, and the unloading station 130 are disposed in one or more enclosures. A plurality of filters 162 is coupled to the body 106 of the enclosure 102. The chamber component cleaning system 100 further includes a component transfer mechanism 132. The chamber component cleaning system 100 allows for automated cleaning of chamber components, with the chamber component entering and exiting the chamber component cleaning system 100 in a dry state. The chamber component cleaning system 100 provides precise control of cleaning mechanisms applied to the chamber component and precise control of the time the chamber component is exposed to cleaning agents.

The input port 108 and the output port 112 allow the chamber component to enter and exit the enclosure 102. The input port door 110 and the output door 114 provide for sealing of the enclosure 102 during the method of cleaning a chamber component. The plurality of filters 162 removes contaminants from the enclosure 102 for a clean environment for cleaning the chamber component.

The component transfer mechanism 132 includes at least one robot 136 coupled to a track 134. The track 134 may be a rail or cable. The robot 136 is configured to travel linearly along the track 134 and have a range of motion to transfer the component between the loading station 116, the spray station 118, the first, second, and third cleaning stations 120, 122, and 124, the dry station 126, the bake station 128, and the unloading station 130. At least one robot 136 allows for multiple chamber components to be transferred between each station such that multiple chamber components can be processed simultaneously.

The robot 136 includes a guide 138, an actuated arm mechanism 140, and a gripper 142. The guide 138 is connected to the track 134 and coupled to an actuator 144 that moves the guide 138 linearly along the track 134. The gripper 142 allows the robot 136 to capture the chamber component from one station and release the chamber component to another station. The actuated arm mechanism 140 has a range of motion to enter and exit each station. The actuated arm mechanism 140 includes a first member 146 and second member 148. The first member 146 is connected to the guide 138 by a hinge 150. The second member 148 is connected to the first member 146 by a hinge 152 and to the gripper 142 by an actuated hinge 154 to provide the range of motion to enter and exit each station. The gripper 142 includes the actuated hinge 154 and a first finger 156 connected to the actuated hinge 154 opposing a second finger 158 connected to the actuated hinge 154 that serves to close the first finger 156 and second finger 158 towards one another and provides a gripping force for the first finger 156 and second finger 158.

The loading station 116 includes a loading platform 160. The loading platform 160 allows for a queue of chamber components during processing so that multiple chamber components can be processed while operating the chamber component cleaning system 100 continuously. The spray station 118 allows for spraying the component with cleaning spray at a first pressure to remove particles on the chamber component. In one embodiment, the cleaning spray includes an aerosol, deionized water (DIW), clean dry air (CDA), high percentage oxygen gas ($O_2$), or nitrogen gas ($N_2$). In another embodiment, the first pressure is between about 15 pounds per square inch (psi) and about 30 psi. The spray pressure can be adjusted according to the type of chamber part being cleaned. A higher pressure provides a larger spray field and more penetrating force to penetrate surface pores and features of the chamber part for thorough cleaning. For more fragile parts, the pressure can be reduced to avoid the possibility of breakage.

The first, second, and third cleaning stations 120, 122, and 124 allow for soaking of the chamber component in a cleaning fluid and forcing the cleaning fluid through features and/or holes of the chamber component to remove particles on the chamber component and from the features and/or holes. The particles can be less than about 1 nanometer (nm) in dimension. In some cases, the cleaning fluid includes hydrogen fluoride (HF), hydrochloric acid (HCl), nitric acid ($HNO_3$), citric acid ($C_6H_8O_7$), ammonium hydroxide ($NH_4OH$), or DIW. The first, second, and third cleaning stations 120, 122, and 124 can be configured to deliver ultrasonic energy to the chamber component to remove particles on the chamber component. The particles that are removed are suspended in the cleaning fluid. The cleaning fluid can be monitored for particle count and particle size to gauge contamination levels of the chamber component. Higher contaminant levels can indicate a need for preventative maintenance (PM). The pH and/or the conductivity of the cleaning fluid disposed in the first, second, and third cleaning stations 120, 122, and 124 and/or the pH can also be monitored and correlated to cleanliness of the chamber component.

Residual cleaning fluid and particles can be removed from chamber components in the dry station 126. The chamber component can also be dried in the dry station 126 using a temperature controlled drying agent, such as $N_2$, CDA, high percentage $O_2$, or alcohol. The drying agent is delivered at a third pressure between about 15 psi and about 30 psi. The bake station 128 allows a baking gas to remove moisture from porosities of the chamber competent and speed up cooling of the chamber component. The unloading station 130 includes an unloading platform 164. The unloading platform 164 allows for a queue of chamber components before the chamber components exit the enclosure 102.

Figure 2:
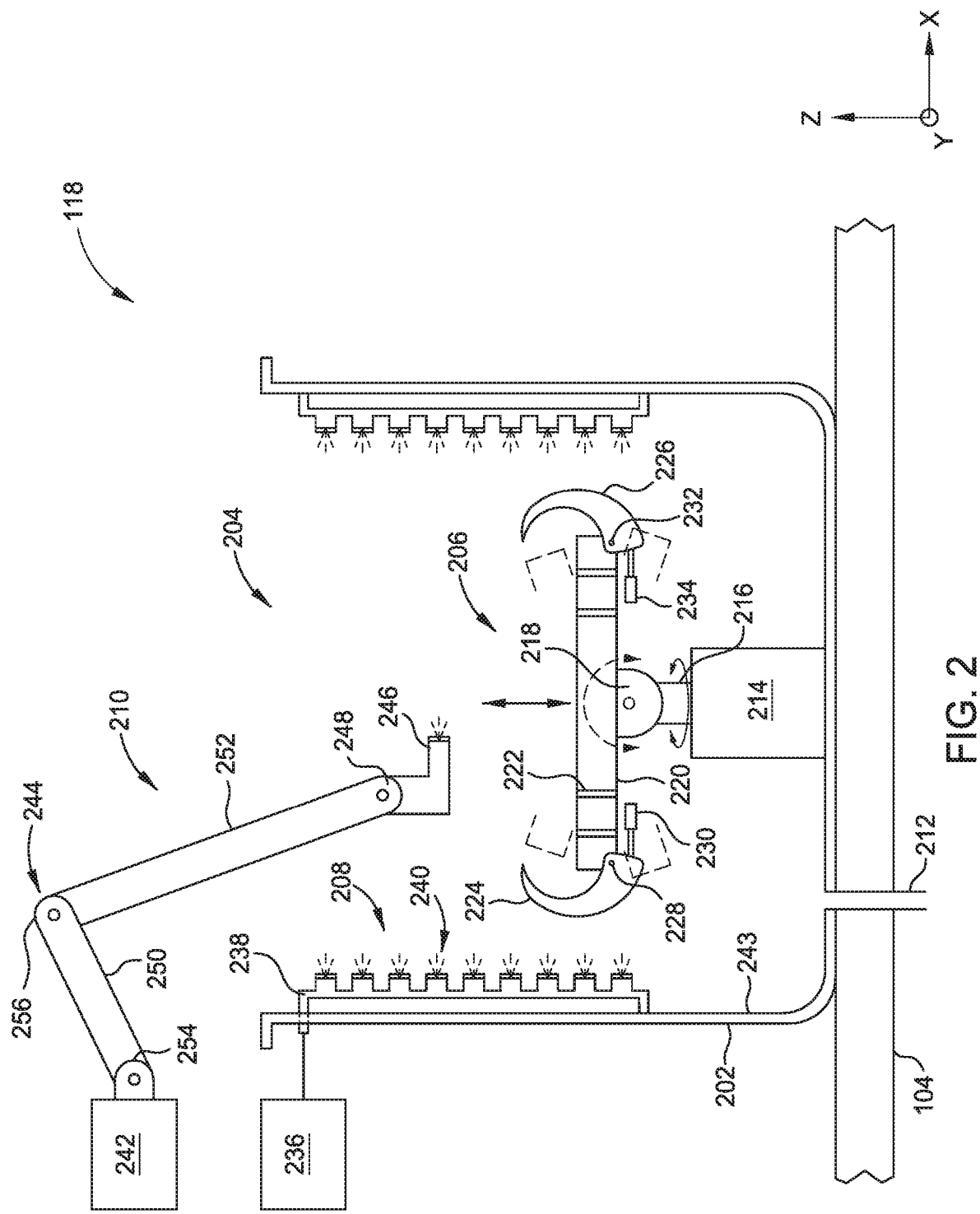
FIG. 2 is a schematic cross-sectional view of a spray station according to an embodiment.

FIG. 2 is a schematic cross-sectional view of the spray station 118. The spray station 118 includes a spay enclosure 202 having an opening 204 and a drain 212. The spray enclosure 202 is disposed on the base 104. The spray station 118 further includes a holder 206, at least one nozzle bar 208 and/or a movable nozzle 210, and a cleaning spray source 236. The opening 204 allows the chamber component to be placed on the holder 206 by the robot 136. The holder 206 holds the chamber component in place during spraying. The drain 212 allows the cleaning spray to be removed from an interior of the spay enclosure 202.

The holder 206 includes a main actuator 214, a stem 216, an actuated hinge 218, a support plate 220 having a plurality of apertures 222 formed therethrough, a first finger 224, and a second finger 226. The first finger 224 is connected to the support plate 220 via the first hinge 228 coupled to the first actuator 230 and the second finger is connected to the support plate 220 via the second hinge 232 coupled to the second actuator 234. The first and second actuators 230, 234 serve to close the first and second fingers 224, 226 and provide a gripping force to retain the chamber component in any orientation. The stem 216 is rotatable about and extendable and retractable along the z-axis of the spray station 118 via the main actuator 214. The support plate 220 is inclinable about the y-axis via the actuated hinge 218. Thus, the chamber component retained via the holder 206 is configured to be positioned in a path of a flow of cleaning spray from the at least one nozzle bar 208 and/or a movable nozzle 210. The plurality of apertures 222 allow a lower surface of the chamber component to be contacted by the cleaning spray.

The at least one nozzle bar includes a plenum 238 connected to a plurality of nozzles 240. The plenum is coupled to a sidewall 243 of the spay enclosure 202 and to the cleaning spray source 236. The plenum 238 is pressurized such that the cleaning spray from the cleaning spray source 236 flows from the plurality of nozzles 240 at the first pressure and removes particles on the chamber component. The movable nozzle 210 includes a support body 242, an actuated arm mechanism 244, and a nozzle 246 connected to an actuated wrist 248. The actuated arm mechanism 244 has a range of motion to position the nozzle 246 near a portion of the chamber component. The actuated arm mechanism 244 includes a first member 250 and second member 252. The first member 250 is connected to the body 242 by a hinge 254. The second member 252 is connected to the first member 250 by a hinge 256. The second member 252 is connected to the actuated wrist 248 such that the actuated wrist 248 further positions the nozzle 246 near a portion of the chamber component. The nozzle 246 positioned near the portion of the chamber component is connected to the cleaning spray source 236 such that the cleaning spray flow from the nozzle 246 at the first pressure and removes particles on the portion of the chamber component.

Figure 3:
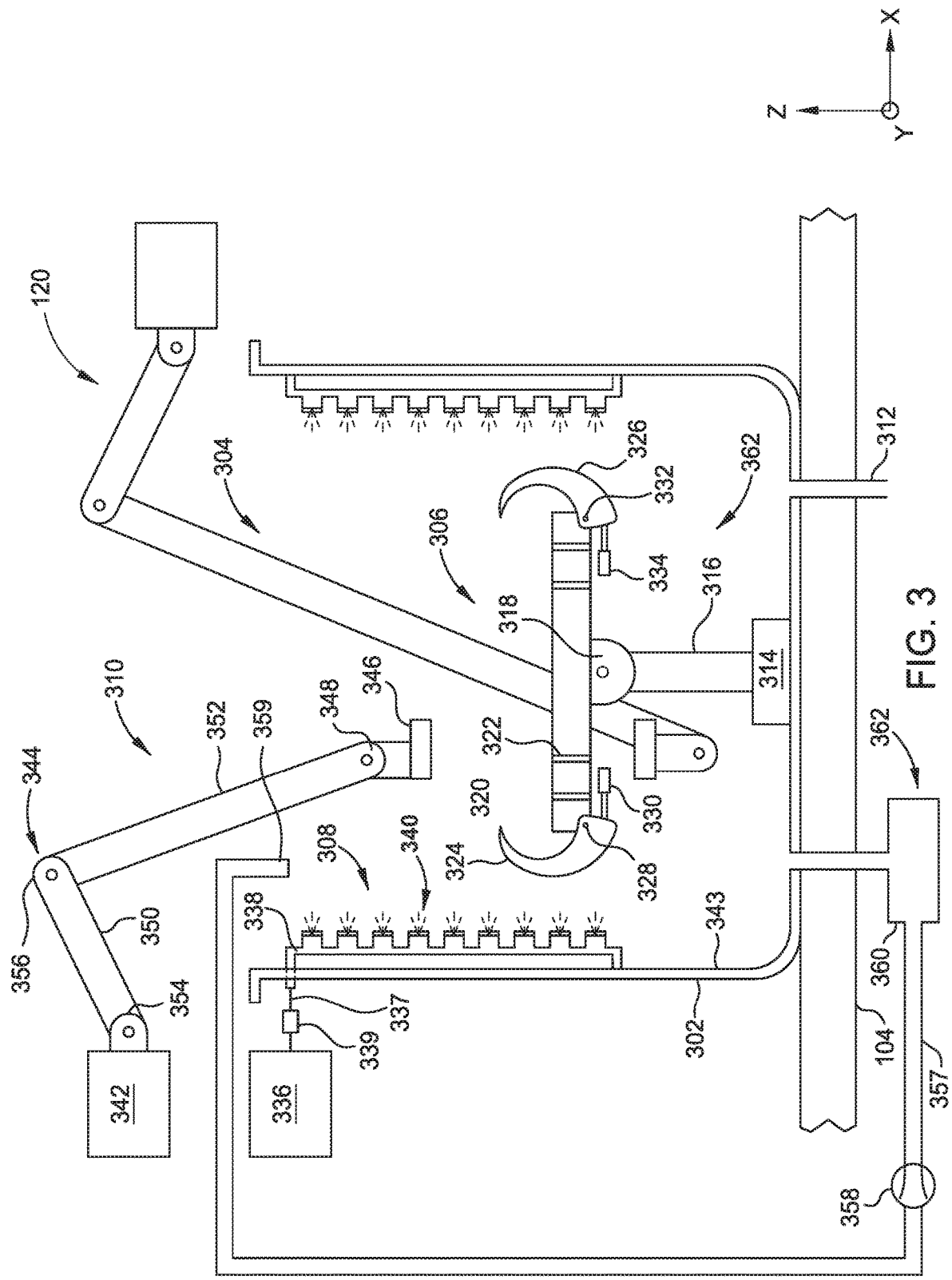
FIG. 3 is a schematic cross-sectional view of a first cleaning station according to an embodiment.

FIG. 3 is a schematic cross-sectional view of the first cleaning station 120. The second cleaning station 122 and third cleaning station 124 are configured in the same manner as the first cleaning station 120. The first cleaning station 120 includes a cleaning enclosure 302 disposed on the base 104 having an opening 304 and a drain 312. The cleaning enclosure 302 includes fluoropolymer materials, such as polytetrafluoroethylene (PTFE), perfluoroalkoxy (PFA), fluorinated ethylene propylene (FEP) and polyvinylidene difluoride (PVDF), to resist chemical and thermal degradation from the cleaning fluid. The actuated arm mechanism 140 and gripper 142 are also coated with fluoropolymer materials. The first cleaning station 120 further includes a holder 306 and at least one nozzle bar 308. Here, the first cleaning station 120 further includes at least one movable transducer 310 to deliver ultrasonic energy to the cleaning fluid retained in the cleaning enclosure 302 to remove particles on the chamber component and a push mechanism, such as a pumping mechanism 362, to force the cleaning fluid through features and/or holes of the chamber component. In one embodiment the ultrasonic energy has a frequency of about 40 kHz to about 128 MHz. The opening 304 allows the chamber component to be placed on the holder 306 by the robot 136. The holder 306 holds the chamber component in place during the soaking and rinsing of the chamber component. The at least one nozzle bar 308 allows for rapid wetting of the chamber component using a flow of cleaning fluid at a second pressure to remove particles on the chamber component. The second pressure is between about 15 pounds per square inch (psi) and about 30 psi.

The holder 306 includes a main actuator 314, a stem 316, a universal joint 318, a support plate 320 having a plurality of apertures 322 formed therethrough, a first finger 324, and a second finger 326. The holder 306 is also coated with fluoropolymer materials to resist chemical and thermal degradation from the cleaning fluid.

The first finger 324 is connected to the support plate 320 via the first hinge 328 coupled to the first actuator 330 and the second finger is connected to the support plate 320 via the second hinge 332 coupled to the second actuator 334. The first and second actuators 330, 334 serve to close the first and second fingers 324, 326 and provide a gripping force to retain the chamber component in any orientation. The stem 316 is rotatable via the main actuator 314 and the universal joint 318 coupled to the support plate 320 allows the chamber component to rotate in any orientation. Thus, the chamber component retained via the holder 306 is configured to be positioned in a path of the flow of cleaning fluid from the at least one nozzle bar 308. The plurality of apertures 322 allow a lower surface of the chamber component to be contacted by the cleaning fluid.

The at least one nozzle bar 308 includes a plenum 338 connected to a plurality of nozzles 340. The plenum is coupled to a sidewall 343 of the cleaning enclosure 302 and to the cleaning fluid source 336 via a fluid conduit 337. The fluid conduit 337 is connected to an inline heater 339 to heat the cleaning fluid to a cleaning temperature between about 20° C. and about 25° C. The plenum 338 is pressurized such that the cleaning fluid from the cleaning fluid source 336 exits the plurality of nozzles 340 at the second pressure and removes particles on the chamber component, and fills the cleaning enclosure 302 to a desired level.

The movable transducer 310 includes a support body 342, an actuated arm mechanism 344, and transducer 346 connected to an actuated wrist 348. The actuated arm mechanism 344 has a range of motion to position the transducer 346 near a portion of the chamber component. The actuated arm mechanism 344 includes a first member 350 and second member 352. The first member 350 is connected to the body 242 by a hinge 354. The second member 352 is connected to the first member 350 by a hinge 356. The second member 352 is connected to the actuated wrist 348 such that the actuated wrist 348 further positions the transducer 346 near a portion of the chamber component. The transducer 346 is positioned near the portion of the chamber component such that the ultrasonic energy is delivered to portion of the chamber component to remove particles on the portion of the chamber component with feedback monitoring and control. In one embodiment, first cleaning station 120 includes a second movable transducer 310 such that ultrasonic energy is applied to multiple portions of the chamber component concurrently to decrease process time. The actuated arm mechanism 344, transducer 346, and actuated wrist 348 are coated with fluoropolymer materials to resist chemical and thermal degradation from the cleaning fluid.

The first cleaning station 120 includes a push mechanism to force the cleaning fluid through features and/or holes of the chamber component. In one embodiment, the push mechanism is a pumping mechanism 362 that includes a sensor box 360 containing at least one sensor coupled to a conduit 357 connected to a pump 358. The conduit 357 has an outlet 359 in the cleaning enclosure 302 so that the pump 358 functions as a diaphragm to incorporate a push mechanism that forces the cleaning fluid through features/or and holes of the chamber and circulates the cleaning fluid. In one embodiment, the push mechanism is a circulation mechanism. In one embodiment, the sensor box 360 contains at a laser particle monitor to monitor the particle size and particle count of the circulated cleaning fluid from the first cleaning station 120. In another embodiment, the sensor box 360 contains a pH sensor and/or a conductivity sensor to monitor the pH and/or the conductivity of the cleaning fluid to determine cleanliness of the chamber component. Adjusting the pH affects electrostatic potential and capillary force, and Van der Waals force holding the particles to the chamber component.

The first cleaning station 120 may be drained through the drain 312. After the first cleaning station 120 is drained the chamber component is soaked with other cleaning fluids that include HF, HCl, HNO$_3$, C$_6$H$_8$O$_7$, NH$_4$OH, or DIW. For example, DIW may be selected to rinse HF, HCl, HNO$_3$, C$_6$H$_8$O$_7$, or NH$_4$OH off the chamber component. The cleaning fluids are selected such that the chemistries of the cleaning fluids oxidize the particles and then etch the oxidized particles. Furthermore, the chamber component may be subjected to zeta manipulation by grounding the chamber component and using a cleaning fluid that has a charge that matches the charge particles that will contaminate the chamber component in future processing. Soaking the chamber component using a cleaning fluid matched to the charge of the particles will result in the chamber component having a residual charge density on the surface of the chamber component that matches the charge of the particles. Thus, the chamber component will overcome the electrostatic force of the particles. For example, a positively charged chamber component will repel positively charged particles. Soaking the chamber component in an acid solution will result in a positive residual charge density. Soaking the chamber component in a basic solution will result in a negative residual charge density.

Figure 4:
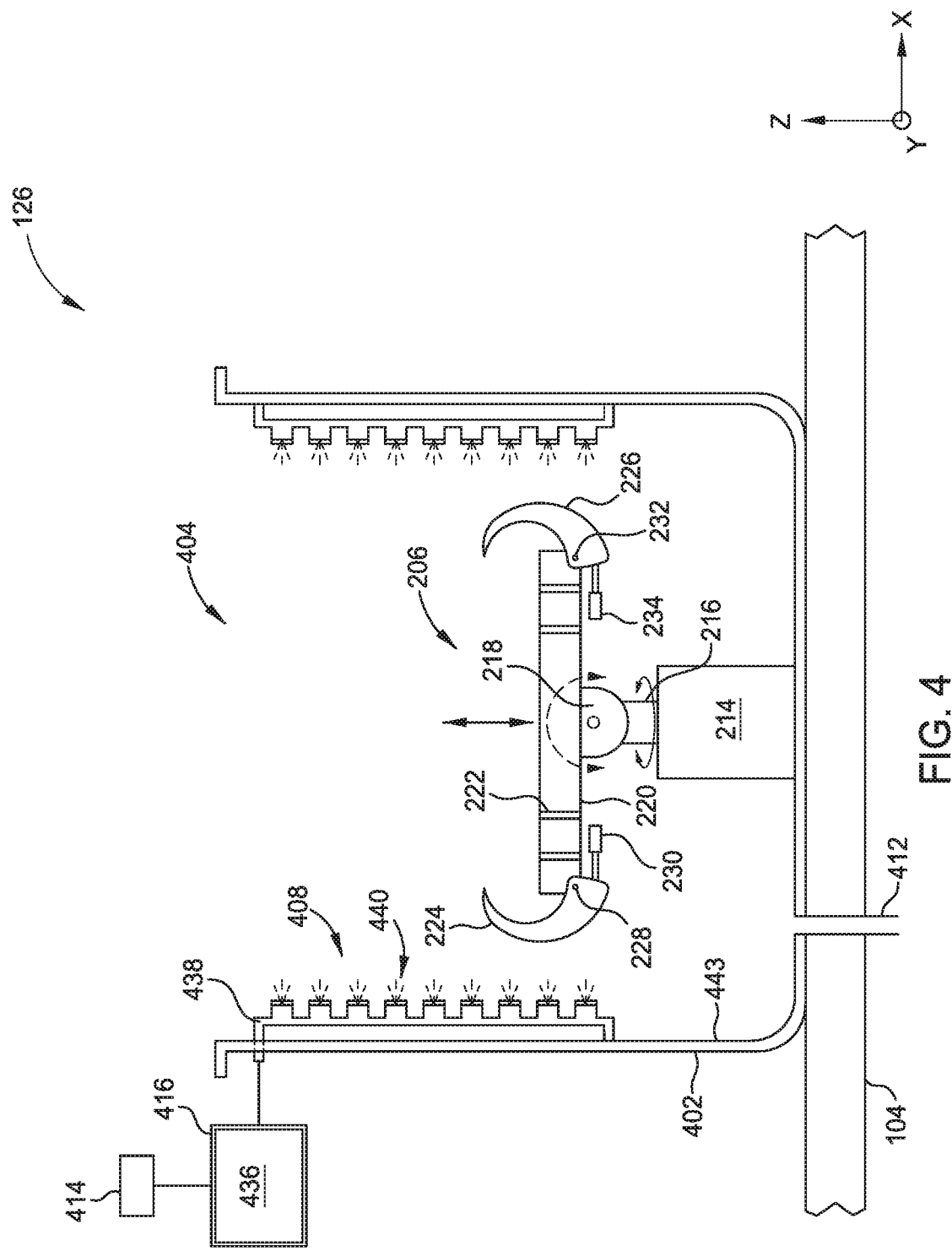
FIG. 4 is a schematic cross-sectional view of a dry station according to an embodiment.

FIG. 4 is a schematic cross-sectional view of the dry station 126. The dry station 126 includes a drying enclosure 402 disposed on the base 104 having an opening 404 and a drain 412. The dry station 126 further includes a holder 206 and at least one drying knife 408 connected to drying agent source 436. The drying agent source 436 includes an insulation layer 416 connected to a heat source 414 such that the drying agent is delivered to the chamber component at a controlled temperature, which can be predetermined. In one embodiment, the temperature is between about 20° C. and about 50° C. The opening 404 allows the chamber component to be placed on the holder 206 by the robot 136. The holder 206 holds the chamber component in place during drying. The drain 412 allows the drying agent to be removed from an interior of the drying enclosure 402.

The holder 206 includes a main actuator 214, a stem 216, an actuated hinge 218, a support plate 220 having a plurality of apertures 222 formed therethrough, a first finger 224, and a second finger 226. The first finger 224 is connected to the support plate 220 via the first hinge 228 coupled to the first actuator 230 and the second finger 226 is connected to the support plate 220 via the second hinge 232 coupled to the second actuator 234. The first and second actuators 230, 234 serve to close the first and second fingers 224, 226 and provide a gripping force to retain the chamber component in any orientation. The stem 216 is rotatable about and extendable and retractable along the z-axis of the dry station 126 via the main actuator 214. The support plate 220 is inclinable about the y-axis via the actuated hinge 218. Thus, the chamber component held on the holder 206 can be positioned in a path of drying agent flowing from the at least one drying knife 408. The plurality of apertures 222 allow a lower surface of the chamber component to be contacted by the drying agent.

The at least one drying knife 408 includes a plenum 438 connected to a plurality of nozzles 440. The plenum 438 is coupled to a sidewall 443 of the drying enclosure 402 and to the cleaning spray source 236. The plenum 438 is pressurized such that the cleaning spray from the drying agent source 436 flows from the plurality of nozzles 440 at the third pressure to remove residual cleaning fluid and residual particles the on chamber component and to dry of the chamber component.

Figure 5:
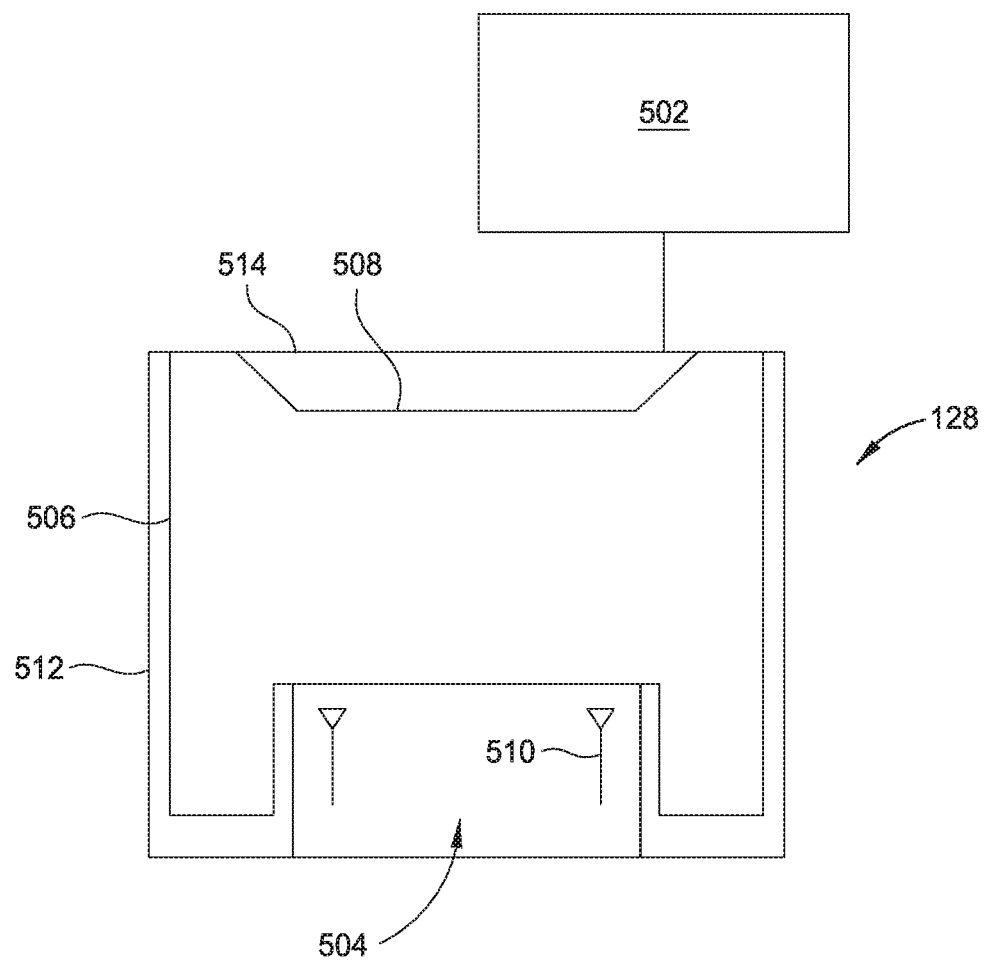
FIG. 5 is a schematic cross-sectional view of a bake station according to an embodiment.

FIG. 5 is a schematic cross-sectional view of the bake station 128. The bake station 128 includes a baking gas source 502, a chamber component support 504, a liner 506, a showerhead 508, lift pins 510, chamber walls 512, and a lid 514. Baking gas is defined as a gas having a mass and/or size greater than that of a water vapor molecule. The baking gas may be an element or compound. The baking gas is non-reactive to the chamber component. Examples of baking gases include, but are not limited to, dry inert gas, dry argon, dry neon and dry nitrogen. The lid 514 allows chamber component to be placed on the chamber component support 504 by the robot 136 and allow for sealing of the bake station 128 during a baking process of the method of cleaning a chamber component. The showerhead 508 allows for blanked delivery of the baking gas to chamber component such that the baking gas removes moisture from porosities of the chamber component and speeds up cooling of the chamber component.

Figure 6:
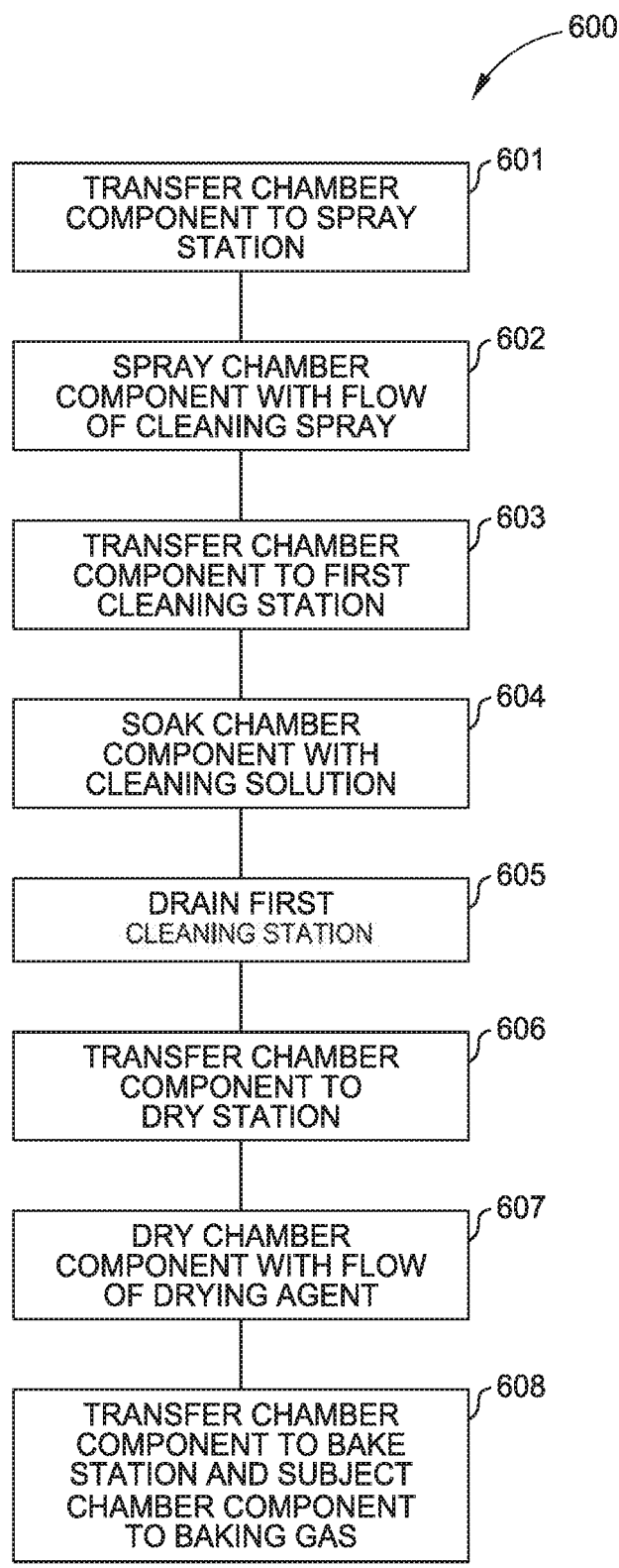
FIG. 6 is a flow diagram illustrating operations of a method for cleaning a chamber component according to an embodiment.

FIG. 6 is a flow diagram illustrating operations of a method 600 for cleaning a chamber component. At operation 601, the component transfer mechanism 132 transfers the chamber component to the spray station 118. In one embodiment, the chamber component is transferred from loading station 116. The chamber component is retained in the holder 206. At operation 602, the chamber component is sprayed using a flow of cleaning spray at the first pressure to remove particles on the chamber component. The cleaning spray from the cleaning spray source 236 flows from the plurality of nozzles 240 of the at least one nozzle bar 208 at the first pressure and/or flows from the nozzle 246 of the movable nozzle 210 that has a range of motion to position the nozzle 246 near to portions of the chamber component. The holder 206 is configured to rotate about and extend and retract along the z-axis of the spray station 118, and incline about the y-axis of the spray station 118 such that the chamber component is positioned in a path of cleaning spray flowing from the at least one nozzle bar 208 and/or a movable nozzle 210.

At operation 603, the component transfer mechanism 132 transfers the chamber component from the spray station 118 to the first cleaning station 120. The chamber component is retained in the holder 306. The chamber component is rapidly wetted while the chamber component is placed in the holder 306 by the cleaning fluid flowing from the at least one nozzle bar at the second pressure. At operation 604, the chamber component is soaked in the cleaning fluid. The first cleaning station 120 is filled by a cleaning fluid flowing from the at the at least one nozzle bar to until the entire chamber component is soaked. In one embodiment, the charge of the particles that may contaminate the chamber in future processing is empirically known. The chamber component is grounded and the cleaning fluid is selected such that the charge of the cleaning fluid matches the particles to charge the chamber component to match the particles. For example, the negatively charge chamber component will repel negatively charged particles. An acid solution corresponds to a positive charge and basic solution corresponds to a negative charge.

In one embodiment, the holder 306 includes the pumping mechanism 362 to incorporate a push mechanism to force the cleaning fluid through features and/or holes of the chamber component and circulate the cleaning fluid. In another embodiment, at least one movable transducer 310 delivers ultrasonic energy to the cleaning fluid to remove particles on the chamber component. For example, two movable transducers 310 maintain a constant gap from and apply ultrasonic energy to portions of the chamber component to decrease process time. During operation 604, the cleaning fluid may be drained while the chamber component is soaking. For example, the rate that the cleaning fluid is drained matches the rate that cleaning fluid flows from the at least one nozzle bar 308 at the second pressure and cleaning temperature. In one embodiment, the circulated cleaning fluid from the first cleaning station 120 is monitored. Measurements of particle size and particle count are monitored for a preventive maintenance and/or a troubleshooting practice based on contamination levels. In one embodiment, the sensor box 360 contains at a laser particle monitor to monitor the particle size and particle count of the cleaning fluid from the first cleaning station 120. In another embodiment, the sensor box 360 contains a pH sensor and/or a conductivity sensor to monitor the pH and/or the conductivity of the cleaning fluid.

At operation 605, the flow of cleaning fluid is discontinued and the cleaning fluid is drained. Operation 604 and 605 are repeated such that the chamber component is soaked with other cleaning fluids that include HF, HCl, HNO$_3$, C$_6$H$_8$O$_7$, NH$_4$OH, or DIW. For example, the DIW may be selected to rinse HF, HCl, HNO$_3$, C$_6$H$_8$O$_7$, or NH$_4$OH off the chamber component. The cleaning fluids are selected such that the chemistries of the cleaning fluids oxidize the particles and then etch the oxidized particles. In one embodiment, a first cleaning fluid is selected from a group consisting of HF, HCl, HNO$_3$, and C$_6$H$_8$O$_7$ to oxidize and etch the particles. A second solution includes DIW to rinse the first cleaning fluid and a third cleaning fluid off the chamber component. The third cleaning fluid includes a basic solution, such as NH$_4$OH, to result in the chamber component having the negative charge of the particles. In one embodiment, the second and third cleaning stations 122, 124 are utilized such that multiple chamber components are cleaned simultaneously. For example, the second cleaning station 122 contains DIW and the third cleaning station 124 contains NH$_4$OH. The component transfer mechanism 132 transfers the chamber components between the first, second, and third cleaning stations 120, 122, 124. For example the component transfer mechanism 132 may transfer the chamber component from the third cleaning station 124 to the first cleaning station 120, from the first cleaning station 120 to the third cleaning station 124, and from the third cleaning station 124 to the second cleaning station 122.

At operation 606, the component transfer mechanism 132 transfers the chamber component to the dry station 126. The chamber component is retained in the holder 206. At operation 607, the chamber component is dried using the flow of the drying agent at the third pressure to remove residual cleaning fluid, remove residual particles on the chamber component, and dry the chamber component. The drying agent from the cleaning spray source 236 flows from the plurality of nozzles 440 of the at least one drying knife 408 at the third pressure and the predetermined temperature. The holder 206 is configured to rotate about and extend and retract along the z-axis of the spray station 118, and incline about the y-axis of the spray station 118 such that the chamber component is positioned in a path of drying agent exiting the at least one nozzle bar 208.

In one embodiment, the method 600 for cleaning a chamber component includes operation 608. At operation 608 the chamber component is transferred to the bake station 128 and is subjected to a baking gas to remove moisture from porosities of the chamber competent and speed up cooling of the chamber component. At the conclusion of the method 600 for cleaning a chamber component the chamber component is transferred to the unloading station 130.

In summation, chamber component cleaning systems and methods for cleaning a chamber component are described herein. The utilization of chamber component cleaning system allows for a method of cleaning a chamber component that is automated with the chamber component entering and exiting the chamber component cleaning system in a dry state. Furthermore, The chamber component cleaning system provides precise control of cleaning mechanisms applied to the chamber component and precise control of the time the chamber component is exposed to cleaning agents.

While the foregoing is directed to examples of the present disclosure, other and further examples of the disclosure may be devised without departing from the basic scope thereof, and the scope thereof is determined by the claims that follow.

The invention claimed is:

1. A chamber component cleaning system, comprising:
an enclosure comprising a body and a base, the body having an input port and an output port for one or more chamber components to enter and exit the enclosure;
a spray station disposed within the enclosure, wherein the spray station comprises a spray station enclosure, a spray nozzle, and a spray station holder operable to retain a chamber component and position the chamber component in a path of a flow of a first cleaning fluid delivered from the spray nozzle disposed within the spray station enclosure;
a first cleaning station disposed within the enclosure, the first cleaning station comprising:
at least one cleaning station nozzle bar disposed in a clean station enclosure, the cleaning station nozzle bar configured to provide a flow of a second cleaning fluid to the chamber component when the chamber component is disposed within the clean station enclosure;
a cleaning station holder operable to retain and rotate the chamber component in any orientation within the clean station enclosure, the cleaning station holder having a plurality of apertures disposed therethrough;
a pumping mechanism, the pumping mechanism operable to force the second cleaning fluid through the plurality of apertures and then through at least one of features and holes of the chamber component;
a sensor box coupled to the first cleaning station via a conduit, the sensor box having at least one sensor operable to monitor at least one of particle size and particle count, and able to monitor pH, and conductivity of the second cleaning fluid pumped to the sensor box; and
at least one movable transducer to provide ultrasonic energy to portions of the chamber component;
a dry station disposed within the enclosure, wherein the dry station comprises a dry station enclosure and a drying knife, the drying knife configured to deliver a drying agent to the chamber component while the chamber component is disposed within the dry station enclosure; and
a component transfer mechanism disposed within the enclosure, wherein:
the component transfer mechanism is configured to transfer the chamber component between at least the spray station, the first cleaning station, and the dry station; and
each of the spray station enclosure, the cleaning station enclosure, and the dry station enclosure have an opening for the component transfer mechanism to capture the chamber component and release the chamber component.

2. The system of claim 1, further comprising:
a second cleaning station disposed on the base and in the body of the enclosure, the second cleaning station having the pumping mechanism and at least the one movable transducer;
a third cleaning station disposed on the base and in the body of the enclosure, the third cleaning station having the pumping mechanism and at least the one movable transducer; and
a bake station disposed on the base and in the body of the enclosure.

3. The system of claim 1, wherein the pumping mechanism comprises the conduit connected to a pump, the conduit having an outlet in the clean station enclosure.

4. The system of claim 1, wherein the component transfer mechanism comprises:
a track; and
at least a one robot comprising:
a guide connected to the track and coupled to an actuator configured to move the guide linearly along the track;
an actuated arm mechanism has a range of motion to enter and exit each opening of the spray station enclosure, the cleaning station enclosure, and the dry station enclosure; and
a gripper configured to capture one or more chamber components and release the chamber components.

5. The system of claim 1, wherein the spray station enclosure, the cleaning station enclosure, and the dry station enclosure comprise fluoropolymer materials.

6. The system of claim 1, further comprising:
a loading station disposed within the enclosure, the loading station having a loading platform for a queue of chamber components; and
an unloading station disposed within the enclosure, the unloading station having an unloading platform for the queue of chamber components.

7. A method for cleaning a chamber component, comprising:
positioning a chamber component into an enclosure of a chamber component cleaning system, the enclosure having a least a spray station, first cleaning station, and dry station disposed therein;
transferring a chamber component to a spray station using a component transfer mechanism;
providing a flow of a cleaning spray at a first pressure on portions of the chamber component and positioning the portions of the chamber component in a path of the flow of the cleaning spray;
transferring the chamber component to a first cleaning station using the component transfer mechanism, the transferring the chamber component to the first cleaning station comprising retaining the chamber component with a holder of the first cleaning station, the holder of the first cleaning station having a plurality of apertures disposed therethrough;
soaking the chamber component in a first cleaning fluid at the first cleaning station;
forcing the first cleaning fluid through the plurality of apertures and through at least one of features and holes of the chamber component with a pumping mechanism, and providing ultrasonic energy to the portions of the chamber component;

pumping at least a portion of the first cleaning fluid to a sensor box with the pumping mechanism, the sensor box coupled to the first cleaning station via a conduit;

monitoring at least one of a particle size and a particle count with at least one sensor of the sensor box;

monitoring a pH and a conductivity of the first cleaning fluid with at least one sensor of the sensor box;

transferring the chamber component to a dry station using the component transfer mechanism; and drying the chamber component in the dry station using a flow of a drying agent at a third pressure and positioning the portions of the chamber component in a path of the flow of the drying agent.

8. The method of claim 7, wherein the soaking the chamber component in at least the first cleaning station comprises:

flowing the first cleaning fluid from at least one nozzle bar at a second pressure while the chamber component is placed in the holder of the first cleaning station configured to retain the chamber component;

rotating the holder of the first cleaning station to orient the chamber component in the path of the first cleaning fluid from the nozzle bar; and continuing the flowing the first cleaning fluid until all of the chamber component is soaked.

9. The method of claim 8, wherein the soaking the chamber component in at least the first cleaning station further comprises draining the first cleaning station at a rate that matches the flowing the first cleaning fluid, the first cleaning fluid contacting a lower surface of the chamber component through the plurality of apertures.

10. The method of claim 8, wherein:
the first pressure is between 15 pounds per square inch (psi) and 30 psi;
the second pressure is between 15 psi and 30 psi;
the third pressure is between 15 psi and 30 psi; and
the cleaning spray comprises an aerosol, deionized water (DIW), clean dry air (CDA), high percentage oxygen gas (O2), or nitrogen gas (N2); and the drying agent comprises N2, CDA, high percentage O2, or alcohol.

11. The method of claim 7, wherein the monitoring the first cleaning fluid comprises measuring the pH the first cleaning fluid using a pH sensor of the sensor box and the conductivity of the first cleaning fluid using a conductivity sensor of the sensor box.

12. The method of claim 7, wherein the soaking the chamber component in at least the first cleaning station further comprises:
soaking the chamber component with the first cleaning fluid in the first cleaning station;
soaking the chamber component with a second cleaning fluid in a second cleaning station; and
soaking the chamber component with a third cleaning fluid in a third cleaning station.

13. The method of claim 12, wherein the first, second, and third cleaning fluid comprise hydrogen fluoride (HF), hydrochloric acid (HCl), nitric acid (HNO3), citric acid (C6H8O7), ammonium hydroxide (NH4OH), or deionized water (DIW).

14. The method of claim 12, further comprising: Zeta manipulating the chamber component in the presence of a charged cleaning fluid, the charged cleaning fluid being one of the first, second, and third cleaning fluids.

15. The method of claim 7, further comprising:
transferring the chamber component from a loading station using the component transfer mechanism;
transferring the chamber component to a bake station from the dry station;
subjecting the chamber component to a baking gas in the bake station; and
transferring the chamber component to an unloading station from the bake station.

16. The method of claim 15, wherein the providing the flow of the cleaning spray further comprises retaining the chamber component in a holder configured to position the chamber component in the path of to the flow of the cleaning spray.

17. The method of claim 7, wherein the providing the flow of the cleaning spray comprises flowing the cleaning spray from at least one nozzle bar or from a movable nozzle bar.

18. The method of claim 7, wherein the soaking the chamber component in at least the first cleaning station further comprises:
soaking the chamber component with the first cleaning fluid in the first cleaning station and draining the first cleaning fluid;
soaking the chamber component with a second cleaning fluid in the first cleaning station and draining the second cleaning fluid; and
soaking the chamber component with a third cleaning fluid in the first cleaning station and draining the third cleaning fluid.

19. The method of claim 7, wherein the providing ultrasonic energy to the portions of the chamber component comprises positioning a movable transducer in the first cleaning station to provide ultrasonic energy to the chamber component.

20. A method for cleaning a chamber component, comprising:
transferring a chamber component to a spray station using a component transfer mechanism;
providing a flow of a cleaning spray at a first pressure on portions of the chamber component and positioning the portions of the chamber component in a path of the flow of the cleaning spray;
transferring the chamber component to a first cleaning station using the component transfer mechanism, the transferring the chamber component to the first cleaning station comprising retaining the chamber component with a holder of the first cleaning station, the holder of the first cleaning station having a plurality of apertures disposed therethrough;
soaking the chamber component at the first cleaning station in a hydrogen fluoride (HF) solution;
forcing the HF solution through the plurality of apertures and through at least one of features and holes of the chamber component with a pumping mechanism, and providing ultrasonic energy to the portions of the chamber component;
pumping at least a portion of the HF solution to a sensor box with the pumping mechanism, the sensor box coupled to the first cleaning station via a conduit;
monitoring at least one of a particle size and a particle count with at least one sensor of the sensor box;
monitoring a pH and a conductivity of the HF solution with at least one sensor of the sensor box;
transferring the chamber component to a second cleaning station using the component transfer mechanism;
soaking the chamber component in the second cleaning station with a deionized water (DIW) solution, forcing the DIW solution through the at least one of features and holes of the chamber component, and providing the ultrasonic energy to the portions of the chamber component;

transferring the chamber component to a third cleaning station using the component transfer mechanism;

soaking the chamber component in the third cleaning station with an ammonium hydroxide (NH4OH) solution, forcing the NH4OH solution through the at least one of features and holes of the chamber component, and providing the ultrasonic energy to the portions of the chamber component;

transferring the chamber component to a dry station using the component transfer mechanism; and drying the chamber component in the dry station using a flow of a drying agent at a third pressure from at least one drying knife and positioning the portions of the chamber component in a path of the flow of the drying agent.

* * * * *